United States Patent [19]

Marshall et al.

[11] Patent Number: 4,977,476
[45] Date of Patent: Dec. 11, 1990

[54] SEMICONDUCTOR SWITCH

[75] Inventors: Andrew Marshall, Stevenage; Derek Colman, Bromham; Philip J. Cavanagh, Biddenham; David P. Dale, Newport Pagnell, all of United Kingdom

[73] Assignee: Texas Instruments Incorporated, Dallas, Tex.

[21] Appl. No.: 164,366

[22] Filed: Mar. 4, 1988

[30] Foreign Application Priority Data

Mar. 6, 1987 [GB] United Kingdom ............... 8705328

[51] Int. Cl.⁵ .............................................. H02H 7/10
[52] U.S. Cl. ........................................ 361/18; 361/58; 361/101; 361/103; 357/40
[58] Field of Search ................... 361/18, 103, 101, 58, 361/91

[56] References Cited

U.S. PATENT DOCUMENTS

| | | | |
|---|---|---|---|
| 3,868,722 | 2/1975 | Le Can et al. | 357/46 |
| 3,959,713 | 5/1976 | Davis et al. | 361/18 |
| 4,021,701 | 5/1977 | Davies | 361/103 |
| 4,040,081 | 8/1977 | Nimomiya et al. | 357/89 |
| 4,146,801 | 3/1979 | Vali et al. | 361/33 |
| 4,439,806 | 3/1984 | Brajder | 361/31 |
| 4,574,205 | 3/1986 | Nagano | 361/103 |
| 4,646,125 | 2/1987 | Takagi | 357/86 |
| 4,698,655 | 10/1987 | Schultz | 361/103 |

FOREIGN PATENT DOCUMENTS

| | | |
|---|---|---|
| 0126879 | 12/1984 | European Pat. Off. . |
| 0186518 | 7/1986 | European Pat. Off. . |
| 1432199 | 4/1976 | United Kingdom . |
| 2079085 | 1/1982 | United Kingdom . |
| 2140204 | 11/1984 | United Kingdom . |
| 2142778 | 1/1985 | United Kingdom . |

Primary Examiner—Todd E. DeBoer
Attorney, Agent, or Firm—William E. Hiller; N. Rhys Merrett; Melvin Sharp

[57] ABSTRACT

There is described a semiconductor switch device having two semiconductor components, the first component receiving drive signals from the second. The first component contains either a single power bipolar switch element for single ended control of the energization of a load or a bridge of such elements enabling energization of a load with different polarities. The switch elements, which may be transistors or darlington multiple transistors, have voltage dropping means connected in the leads to their control bases, so that the drive signals from the second component can be produced by low impedance connection to one or other supply connductor, thereby keeping the power dissipation of the second component to a low value. The voltage dropping means may be a series resistor or a constant current circuit. The first component may have temperature sensitive means, such as a diode, for diverting current from the control base of the or each switching element to terminate its conduction if the temperature of the component becomes too high. The switch device is used in a switching system for a motor vehicle, for example, where central control is required of a plurality of loads at various locations. A central controller transmits coded control signals to local controllers which direct the control signals to the correct switch devices. Status signals representing the functional states of the loads and the outputs of local sensors are sent to the central controller to produce there a corresponding display.

9 Claims, 5 Drawing Sheets

SEMICONDUCTOR SWITCH

This invention relates to semiconductor switches.

Traditionally the feeding of electrical power to ancillary devices of a motor vehicle such as lamps for marking the boundaries of the vehicle, lighting the road ahead or indicating an intention to move to the left or to the right, or electric motors for driving a windscreen wiper, fans, fluid pumps or raising and lowering windows, for example, has been controlled by switches near the steering wheel connected to the devices by individual wires of sufficient thickness to carry the currents involved. The cost of such wiring and switches is a major component in the overall cost of the vehicle and their total weight is considerable. Moreover the mechanical switches can be unreliable because of contact fouling and erosion.

The need for a loom of wires and switches capable of carrying the currents can be avoided by the use of relays local to the devices but a complex wiring loom is still required for the operating signals for the relays and the relays are still subject to wear, such as contact erosion.

In order to eliminate the need for the wiring loom and to improve the reliability of the system it has recently been proposed to provide perhaps only one current carrying conductor for all the ancillary devices, which are connected to the conductor through individual local switches and to multiplex control signal for these switches on to a signalling conductor. The switches have decoding circuits for detecting the control signals addressed to them and power switches for implementing the control required. Although relays could be used in such multiplexed control systems for switching the power to the loads, it is preferable to use semiconductor switches because not only are they more reliable but also then enable the functioning of the system and the load itself to be monitored. Additionally the elimination of mechanical contacts means that the system is safer because no sparks are produced.

Various proposals for a semiconductor switch for such an application have been made. Circuits composed of discrete devices have been too expensive for wide acceptance. Circuits using a single semiconductor die, though still expensive, would be cheaper in volume production but have suffered from the disadvantage, arising from the use of a DMOS output stage, that they cannot achieve the low voltage drop when on, required with currents up to for instance 6 amps with a heat sink temperature of up to 110° C.

It is an object of the present invention to provide a semiconductor switch suitable for a multiplex wiring system for a motor vehicle in which the above disadvantages are overcome. Although the invention is of particular value in the motor vehicle application it can also be used in a wide range of other industrial and consumer application.

According to one aspect of the present invention there is provided a semiconductor switch device reponsive to a control signal selectively to pass current to a load and to block the passage of current to the load and including a first semiconductor component containing one or more power bipolar semiconductor switching elements each of vertical construction having a controlled current path extending from one major face to the other of a semiconductor body and arranged for connection in series with the load across a power supply, and control input means connected to the control base of the or each power bipolar semiconductor switching element, and a second semiconductor component containing means responsive to the control signal selectively to produce drive signals which are applied to the control input means of the first semiconductor component for causing the power bipolar semiconductor switching element or elements to conduct, wherein the control input means includes voltage dropping means formed in the control base region of the or each power bipolar semiconductor switching element.

The power bipolar semiconductor switching element may be a transistor or a darlington multiple and may be made in different current handling capacities to suit different loads.

The first semiconductor component may include a single power bipolar semiconductor switching element which is connected in series with the load to switch on and off the electric current through the load. Alternatively, the first semiconductor component may include a bridge circuit of power bipolar semiconductor switching elements with the power supply and the load connected so that not only can the electric current feed to the load be switched on and off but also its polarity can be reversed. The drive signals produced by the second semiconductor component are arranged to provide the polarity of energisation of the load indicated by the control signals. The four switching elements each with its own voltage dropping means may be formed on separate semiconductor bodies or in pairs on two semiconductor bodies. If all four switching elements are formed on a single semiconductor body steps must be taken to isolate the collectors of one pair of elements from the collectors of the other pair.

The voltage dropping means may consist of a series connected resistor or constant current circuit in the base lead of the or each power bipolar semiconductor switching element.

The second semiconductor component may be an integrated circuit of relatively small current handling capacity dissipating relatively little heat since the drive signal for the power bipolar semiconductor switching element can be derived from the power supply through a transistor or transistors in very low or very high resistance states only, because the voltage dropping means for determining the drive current of the power switching element is provided in the first semiconductor component.

The second semiconductor component may be arranged to monitor the current through the load and the voltage applied to it to detect, for example, open-and short-circuit conditions of the load, and produce an output indication of such abnormal status of the load. Timing means may be provided in the second semiconductor component to determine the time for which an excessive current is drawn by the load, and to terminate the drive current to the first semiconductor component if the excessive current is drawn for more than a predetermined time.

The first semiconductor component may include a temperature sensor such as a diode or Schottky diode integrated with the power bipolar semiconductor switching element (s). The forward conduction voltage or the reverse bias leakage current of such a diode would indicate the temperature component. The sensor may be connected to divert current from the base of the switching element to tend to terminate its conduction if the temperature becomes too high.

The two semiconductor components may be assembled into separate packages or a single package. Since most of the heat dissipation will be from the first component the packaging may be arranged so that this component is attachable to a heat sink, and no particular arrangements need be made to dissipate the heat from the second component.

According to a second aspect of the invention there is provided a semiconductor component having a power bipolar semiconductor switching element of vertical construction in a semiconductor body with a controlled current path extending from one major face to the other of the semiconductor body and arranged for connection in series with a load across a power supply and a control input terminal connected to the control base of the semiconductor switching element through voltage dropping means formed in the control base region of the semiconductor switching element.

The semiconductor switching element may be a transistor or a darlington multiple.

The voltage dropping means may be a resistor or a constant current circuit connected in a series path from the control input terminal to the control base of the semiconductor switching element.

An over-temperature sensor may be provided in the semiconductor body to detect excessive current through the switching element for a period of time. The sensor may be a diode or a Schottky diode of which either the voltage across it in forward conduction or the reverse bias leakage current is monitored. The sensor may be connected to divert current from the base of the switching element to terminate its conduction of the temperature of the semiconductor body becomes too high.

According to a third aspect of the invention there is provided a semiconductor component having a power bipolar semiconductor switching element of vertical construction in a semiconductor body with a controlled current path extending from one major face to the other of the semiconductor body and arranged for connection in series with a load across a power supply, a control input terminal connected to the control base of the semiconductor switching element through voltage dropping means and an overtemperature sensor in the semiconductor body responsive to excessive temperature of the semiconductor body to divert drive current from the control base of the switching element and terminate its conduction if the temperature of the semiconductor body becomes too high.

The semiconductor switching element may be a transistor or a darlington multiple.

The voltage dropping means may be a series resistor or a constant current source circuit and may be formed in the control base region of the semiconductor body.

The overtemperature sensor may be either a bipolar diode or a Schottky diode of which either the voltage across it in forward conduction or the reverse bias leakage current is used to control the diversion of the drive current.

According to a further aspect of the invention there is provided a switching system for enabling electrical power to be applied selectively to a plurality of loads in which control signals are transmitted from a central controller to a plurality of local switches respectively connected to the loads, each local switch including a first semiconductor component containing one or more power bipolar semiconductor switching elements each of vertical construction and having a controlled current path extending from one major face to another of a semiconductor body arranged for connection in series with the load across a power supply, and control input means connected to the control base of the or each power bipolar semiconductor switching element through voltage dropping means formed in the control base regions, and a second semiconductor component containing means responsive to the control signal selectively to produce drive signals which are applied to the control input means of the first semiconductor component for causing the power bipolar semiconductor switching element or elements to conduct.

The control signals may be transmitted from the central controller to the local switches via a common control line to a plurality of local controllers each connected to one or more local switches via individual lines, the local controllers including decoding means responsive to codes contained in the control signals to detect and forward the control signals to the local switches to which they are addressed.

The local switches may be arranged to generate status signals indicating the functional states of the loads to which they are connected, the status signals being returned to the control controller where a display of the status, particularly if it is a fault, may be produced. Where a local controller is provided it may additionally or alternatively be connected to one or more local sensors and generate report signals indicating the sensed conditions which are transmitted to the central controller for display or monitoring.

The switching system may be used in a vehicle such as a motor vehicle, the central controller being arranged to respond to inputs from the driver to produce control signals and to produce displays visible to him.

In order that the invention may be fully understood and readily carried into effect, embodiments of it will now be described with reference to the accompanying drawings, of which.

Figure 1:
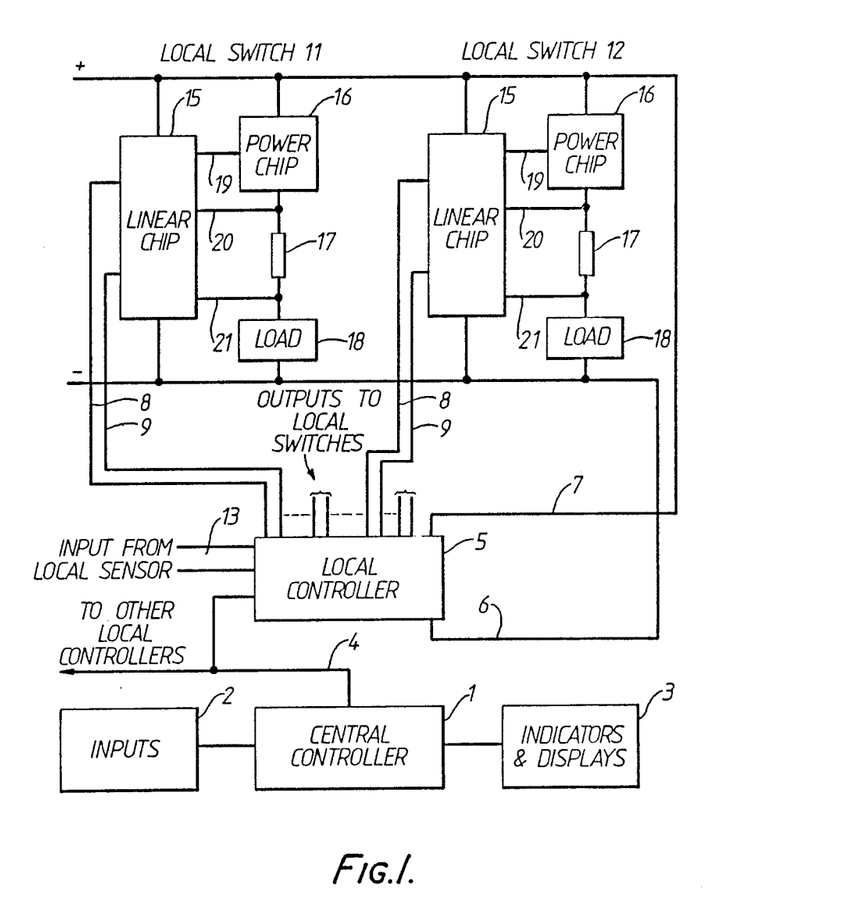
FIG. 1 is a diagram of an example of a system incorporating switches according to an example of the invention.

The system shown in FIG. 1 could be used in a motor vehicle or in an industrial or domestic installation where remote control of the energisation of a number of electrical devices is required. A central controller 1 is connected to receive inputs from a unit 2, which may, for example, comprises a keyboard or a plurality of manually operable switches, and supplies outputs to indicators and displays 3, including, for example, warning lamps, light-emitting diode and/or liquid crystal displays, and digital to analogue converters connected to meters.

The central controller 1 is connected via a bus line 4 to a plurality of local controllers of which only one is shown having the reference 5. The local controller 5 is energised via power supply conductors 6 and 7, for example connected to the motor vehicle battery, and these conductors with the bus line 4 may conveniently be formed into a single cable which is routed about the vehicle as required. Alternatively the earth return may be through the body-chassis structure of the vehicle in which case the earthed conductor may be omitted. The local controller 5 is connected via individual conductor pairs 8, 9 to local switches of which only 2 are shown having the references 11 and 12. The local controller 5 is also connected via conductors 13 to receive inputs from local sensors of which only one is shown.

Each local switch, 11 or 12, includes a linear chip 15 to which the conductor pair 8, 9 is connected, a power chip 16 and a resistor 17. The power chip 16 and the resistor 17 are connected in series with each other and in series with a load 18, the energisation of which the local switch is to control, across the power supply conductors 6 and 7. The linear chip 15, which is also connected to the power supply conductors 6 and 7, is connected to control the power chip 16 via a conductor 19 and has two other leads 20 and 21 connected respectively to the end terminals of the resistor 17.

The central controller 1, which may be constructed as a conventional microcomputer having a microprocessor connected by data and address buses to random access memory, read-only memory and input-output circuitry, repeatedly scans the switches in the input unit 2 and reacts whenever there is a change in the state of the switch. The status of the switches are stoired in the random access memory of the controller 1, and depending on the change of state of the switches in the unit 2, the controller 1 generates coded control signals representing the changes of energisation, off or on, required for the various loads 18. These coded control signals are multiplexed onto the conductor 4 and each includes a code identifying to which of the loads 18 the control signal is addressed.

A local controller 5, which may also include a conventional microcomputer, detects those of the coded control signals which are addressed to loads under its command and records the energisation status of those loads, changing the status in response to the coded control signals as they are received. The local controller 5 generates an output on the conductor 9 which is connected to the local switch, say 11, controlling the energisation of the load 18 to which the change relates. In the local switch the linear chip 15 contains a multivibrator the state of which is set or reset depending on whether or not the corresponding load 18 is to be energised or not. The linear chip 15 provides a drive signal via the conductor 19 to switch on and off a power transistor included in the power chip 16, thereby switching the energisation of the load 18 on and off. The resistor 17 included in series with the load 18 will develop a voltage due to the current through the load, which voltage is conveyed by the conductors 20 and 21 to the linear chip 15. In addition, the voltage across the load 18 is also provided by the conductor 21. The linear chip 15 contains circuitry for detecting short and open circuit conditions of the load 18 and a signal representing these conditions is conveyed by the conductor 8 back to the local controller 5. Preferably, the signal on the conductor 8 from the linear chip 15 which represents satisfactory operation of the load is an active one so that should the local switch fail an indication of its failure will be conveyed to the local controller 5.

The status information obtained from the local switches together with data from local sensors connected to the controller 5 are stored in it and communicated to the central controller 1 between the multiplexed coded control signals emitted by the controller 1. Typically, a local sensor may include a variable resistor the resistance of which is controlled by the quantity being sensed, and an analogue to digital converter is used to change a voltage proportional to that resistance to a digital value which is used by the local controller 5. The indicators and displays 3 are energised by the central controller 1 to provide information to the driver of the quantities sensed by the various local sensors, the energisation of the various loads 18 and whether any of those loads has failed.

Figure 2:
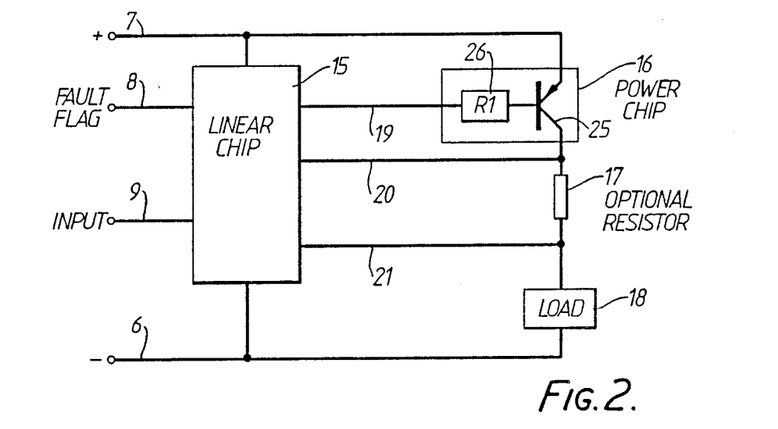
FIG. 2 is a diagram of the switch used in FIG. 1.

FIG. 2 shows in some more detail the construction of a local switch and in this figure the reference numerals used correspond to those used in FIG. 1.

As shown in FIG. 2, a power chip 16 includes a PNP power transistor 25 and a resistor 26 connected in series in its base connection. It is a feature of the present invention that the local switch consists of two semiconductor dies, the linear chip 15 and the power chip 16, which may be assembled into two packages or combined into a single package. As mentioned above, the linear chip contains all the logic to communicate with the central controller via the local controller, to detect fault conditions and to control the power chip. The power chip reacts to the control signals from the linear chip and switches the current to the load 18. The PNP transistor 25 in the power chip is constructed so as to be capable of handling the current required by the load 18 with a sufficiently low voltage drop through its controlled current path when on.

In a modification the PNP transistor may be replaced by a darlington pair or triple.

The PNP transistor 25 has the resistor 26 connected in series in its base lead, which is integrated into the semiconductor die on which the power transistor is formed, to provide a voltage drop so that the drive signal applied to the conductor 19 by the linear chip is connected through low resistance switches either to the negative supply conductor 6 or the positive supply conductor 7, so that power dissipation in the linear chip 15 arising from the control of the drive current for the transistor 25 is very low, and a major part of the heat dissipation of the switch is from the power chip 16 rather than the linear chip 15. This means that the heat sinking requirements of the local switch as a whole can be concentrated on the power chip 16, with very relaxed assembly requirements for the linear chip 15 which can therefore be mounted in a low cost package.

The use of a PNP transistor as a switch element of the power chip provides an optimum solution for a motor vehicle environment due to its very low on-voltage capability. As mentioned above, the transistor could be replaced by a darlington multiple, such as a darlington pair, which would give a much greater gain and allow the switching of higher load currents using a low drive current from the linear chip 15.

Figure 3:
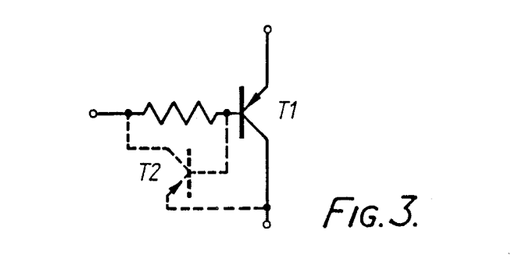
FIG. 3 shows the circuit of a power transistor suitable for use in the switch of FIG. 2 with a resistor integrated into the base lead producing a parasitic transistor.

The use of a simple series resistor as the voltage dropping structure connected in the base lead of the PNP transistor has the advantage that it can be produced as part of the emitter diffusion process or by a separate diffusion step during the fabrication of the transistor. The resistor has the disadvantage that it results in a parasitic transistor being formed which can bypass a fraction of the base drive current when the PNP power transistor is in saturation. FIG. 3 is a circuit diagram showing the parasitic transistor as T2 connected to the power transistor T1. The bypassing of the base drive current can be reduced by including an extra heavy base diffusion around the region forming the resistor. This extra diffusion is shown in FIG. 4, which shows a diagrammatic cross-section of the PNP power transistor and the series resistor connected in its base lead.

Figure 4:
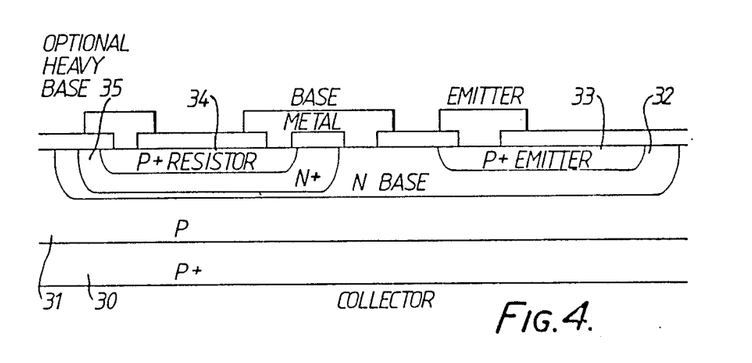
FIG. 4 is a cross-sectional diagram of the transistor shown in FIG. 3.

In FIG. 4, an epitaxial layer 31 of P-type conductivity is formed on the surface of a P+-conductivity substrate 30. A base region 32 of N-type conductivity is formed in the epitaxial layer 31, and an emitter region of P+-type conductivity is formed in the base region. This constitutes the PNP power transistor. The resistor is formed by a P+-conductivity region 34 in an extra heavy base diffusion region 35, itself within the base region 32. As mentioned above, the extra heavy base region 35 serves to reduce the gain of the parasitic inverse transistor shown as T2 in FIG. 3.

Figure 5:
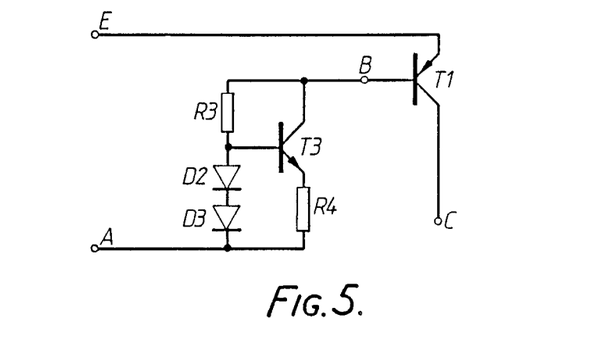
FIG. 5 is the circuit of an alternative power transistor suitable for use in the switch of FIG. 2 with a constant current source integrated into the base lead in place of the resistor shown in FIG. 3.

A constant current source circuit can be used instead of the simple resistor in the base lead of the transistor switch element. FIG. 5 shows such a circuit connected in series in the base lead of the power transistor T1 and includes an PNP transistor T3 having its emitter lead connected through a resistor R4 to a terminal A and having its collector connected to the base of the transistor T1. A series chain of resistors R3 and two diodes D2 and D3 is also connected from the base of the transistor T1 to the terminal A with the junction between the resistor R3 and the diode D2 being connected to the base of a transistor T3. The operation of the constant current circuit is conventional in that the forward conduction voltage of the diodes D2 and D3 provides a bias voltage for the transistor T3 to conduct just sufficient current through the resistor R4 to maintain the transistor T3 in conduction. Although the fabrication of the constant current source requires an extra diffusion step as compared with the fabrication of the simple resistor shown in FIG. 4, the use of a constant current source has the advantage that the base current of the power transistor T1 is independent of the supply voltage which in a motor vehicle can vary between 7 and 16 volts. Since the base current of the power transistor T1 is kept constant, the drive current produced by the linear chip 15 can be kept more nearly to the minimum necessary to operate the power transistor with the result that the size and cost of the linear chip can be considerably reduced.

Figure 6:
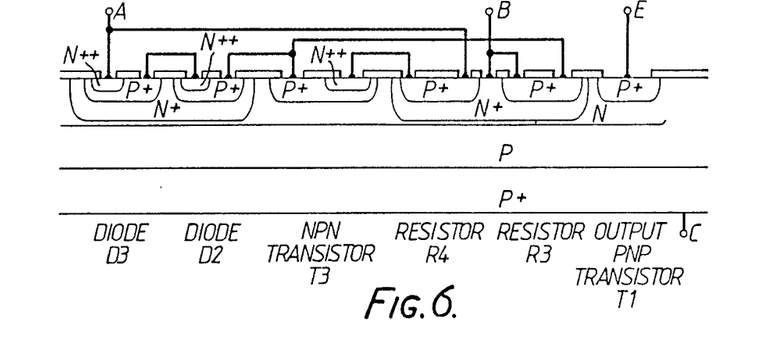
FIG. 6 is a cross-sectional diagram of the transistor shown in FIG. 5.

FIG. 6 is a cross-sectional diagram of the circuit shown in FIG. 5 formed in a semiconductor body. The parts of the structure which constitute the elements of the circuit shown in FIG. 5 are indicated in FIG. 6. The constant current source circuit also produces a parasitic transistor in a similar way to the resistor, and the effects of this parasitic transistors are reduced as described above by the provision of N+regions containing the resistors and diodes of the circuit.

The power chip may be provided with internal self-protection against excessive current through it due to short-circuits, for example, and to excessively high temperatures which could lead to damage to the semiconductor devices. As mentioned above, the linear chip can be used to detect short-circuiting of the load 18 by monitoring the voltage on the conductor 21. Because of the nature of the loads in certain instances, for example incandescent lamps or motors, the load itself may appear as a short-circuit when first turned on and only reach its normal running resistance after a delay of a fraction of a second. It follows therefore that any protection against excessive current through the power chip must have a built-in delay before conduction is terminated to protect the semiconductor devices. To provide this delay the linear chip may be provided with a timer which prevents any protective action being taken until an appropriate delay of, say, 0.3 seconds has elapsed following the start of an apparent short-circuit. If the voltage across the load or the current through it has not reached an acceptable value within the delay period, then the linear chip would be arranged to remove the drive current from the power chip to provide a controlled shut down of the circuit. The load current may alternatively be monitored by measuring the voltage across the resistor 17 connected in series with the load. This resistor need not be a discrete element or a thin or thick film deposited layer, but may simply be a section of printed circuit board conductor which is already included in the system.

An alternative to measuring the excessive current after a delay time, is to integrate into the power chip an over-temperature sensor. The use of such a sensor has the advantage that the necessary time delay is automatically provided by the heat capacity of the chip itself and, in addition, monitors the temperature of the chip which is a certain indicator of the likelihood of damage to the chip. In one example of the over-temperature sensor, a forward biased diode is provided on the power chip and receives a small current from the linear chip. The voltage drop across the diode is monitored by the linear chip to provide information to that chip relating to the temperature of the power chip. In another example, the diode on the power chip is reverse biased and the leakage current from the diode is monitored by the linear chip to provide information about the temperature of the power chip. The sensitivity of the measurement provided by the latter example would be enhanced by the use of a Schottky diode having a higher reverse bias leakage current. A disadvantage of this arrangement is that it requires two additional connections from the linear chip to the power chip.

Figure 7:
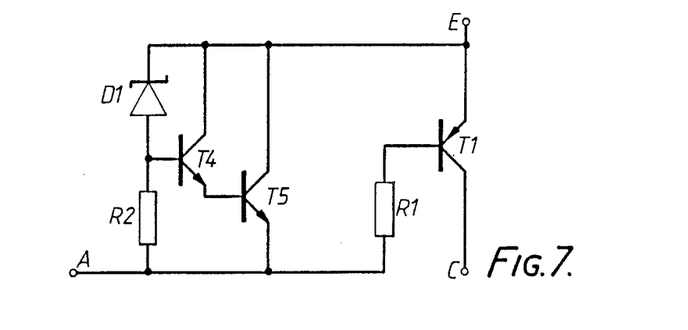
FIG. 7 shows the circuit of a power transistor with one form of over-temperature protection.

A further example which requires no additional connections from the linear chip to the power chip involves providing a diode or other temperature sensor structure on the power chip together with necessary extra circuitry for diverting the base drive current of the power transistor away from the base so as to starve the transistor of base drive and turn it off. FIG. 7 shows the circuit of an example in which the leakage current of a Shottky diode D1 fed through a resistor R2 from the base drive circuit for the power chip is amplified by a darlington pair consisting of transistors T4 and T5.

The use of an over-temperature sensor obviates the need for a timer on the linear chip, thereby giving a considerable saving in die area and therefore cost.

Figure 8:
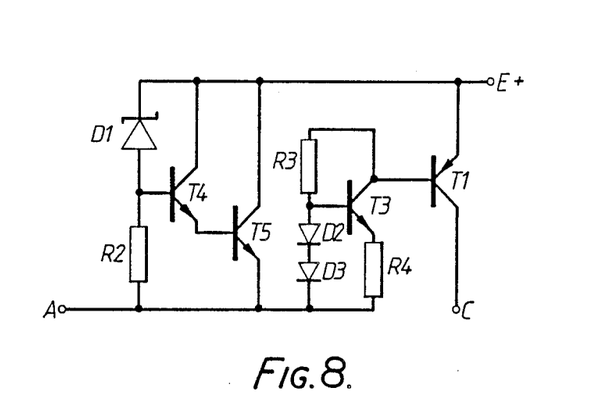
FIG. 8 shows the transistor of FIG. 5 with the over-temperature protection shown in FIG. 7.
Figure 9:
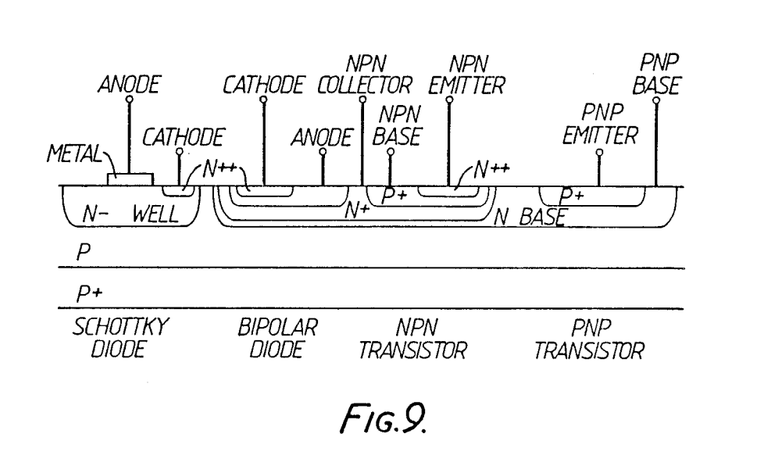
FIG. 9 is a cross-sectional diagram of parts of the transistor shown in FIG. 8.

The over-temperature sensor just described may be combined with the constant current circuit shown in FIG. 5, giving the circuit shown in FIG. 8. The individual circuit elements are shown in the cross-section of a semiconductor body in FIG. 9. To produce the circuit of FIG. 8 it is necessary to produce appropriate numbers of components required by the circuit and interconnect them as shown in the figure.

Figure 10:
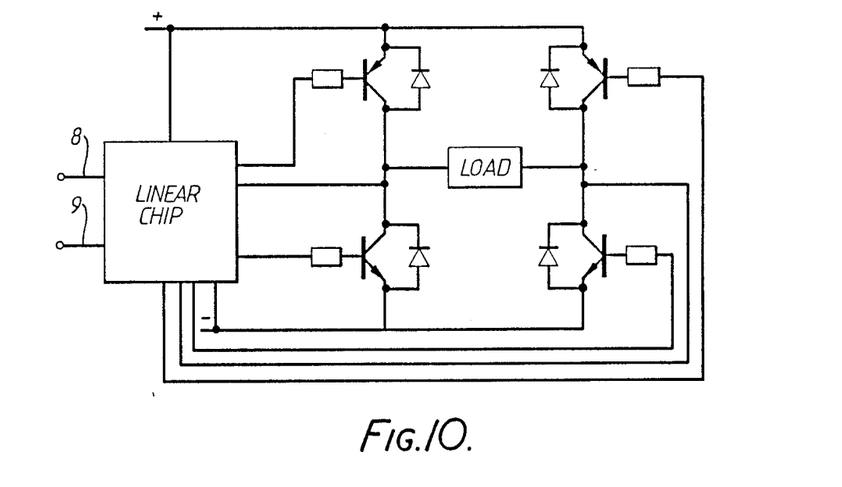
FIG. 10 is a diagram of an alternative form fo switch for energising a load with currents of different polarities.

As described above, the local switches are suitable for single ended loads with one terminal grounded. Many electric motors in motor vehicles, however, require switching of the direction of the current flow to reverse the motor. An example of this is the use of a motor to open and close the windows of the vehicle. Reversal of the current flow could be achieved by the use of four semiconductor switching elements, such as transistors each with additional circuit components as described above, connected in a bridge configuration with the power supply connected across one diagonal of the bridge and the load connected across the other diagonal. Obviously, the linear chip controlling such a power chip or chips would have to be able to turn on diagonally opposite pairs of transistors depending on the direction of current flow required through the load. FIG. 10 is a diagram of a suitable circuit for such a local switch. The transistors together with their base series resistors or other circuits may be formed on separate chips or combined on one or two chips.

Figure 11:
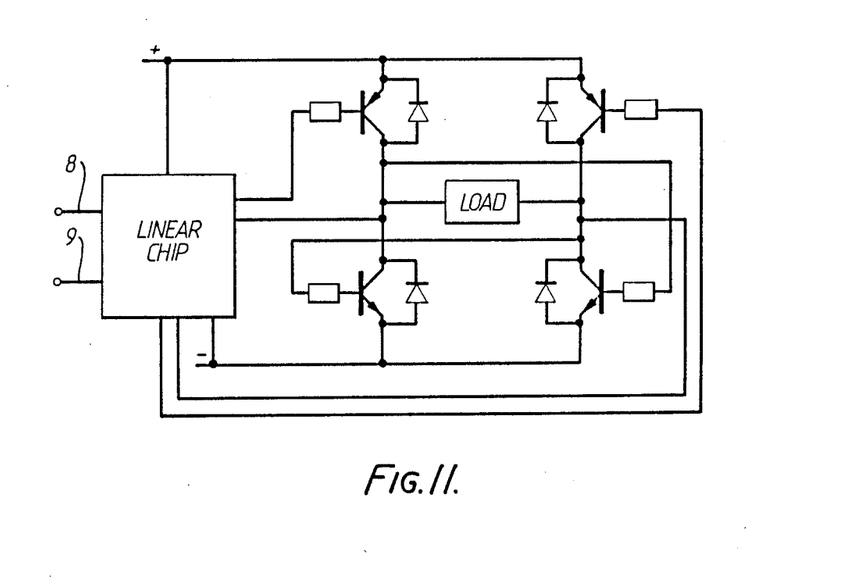
FIG. 11 shows a modification to the switch shown in FIG. 10.

FIG. 11 shows a modification of FIG. 10 in which two transistors are connected to be driven directly from the linear chip and the other two transistors are driven by the output currents of the first two transistors. This arrangement has the advantage of reducing the dissipation from the linear chip and also simplifying it.

Although the invention has been described with reference to specific examples concerned with the particular problems encountered in motor vehicles, it will be appreciated that the same techniques would be applicable to the energisation of a plurality of remotely located loads from a central control position both in domestic and industrial environments.

What we claim is:

1. A semiconductor switch device responsive to a control signal selectively to pass electric current to a load and to block the passage of electric current to the load, said semiconductor switch device comprising:

first semiconductor component means including at least one power bipolar semiconductor transistor comprising:

semiconductor substrate means of one conductivity type having top and bottom major surfaces, a first dopant region of the other conductivity type in said semiconductor substrate means of said one conductivity type and opening onto the top surface thereof, a second dopant region of said one conductivity type disposed in said first dopant region of the other conductivity type and opening onto the top surface thereof, a third dopant region of the other conductivity type disposed in said first dopant region of the other conductivity type and opening onto the top surface thereof, said third dopant region of the other conductivity type having a higher dopant concentration than said first dopant region of the other conductivity type and being disposed in spaced relation to said second dopant region of said one conductivity type provided in said first dopant region of the other conductivity type, said semiconductor substrate means of said one conductivity type and said first, second and third dopant regions defined therein forming a vertically arranged bipolar transistor having said first dopant region of the other conductivity type as the base, said second dopant region of said one conductivity type as the emitter, and the bottom portion of said substrate means as the collector and having a controlled current path extending from the top surface thereof to the bottom surface thereof, and control input means connected to the base of said bipolar transistor and including voltage dropping means;

second semiconductor component means connected to said control input means and including means responsive to a control signal selectively to produce output drive signals applied to said control input means of said first semiconductor component means for activating said power bipolar semiconductor transistor to be conductive;

the collector of said power bipolar semiconductor transistor being adapted to be connected in series to the load; and said power bipolar semiconductor transistor switching from a non-conductive state to a conductive state for providing electric current to the load in response to an output drive signal from said second semiconductor component means applied to said control input means.

2. A semiconductor switch device as set forth in claim 1, wherein said first semiconductor component means comprises four power bipolar semiconductor transistor interconnected in a bridge circuit;

the load being adapted to be connected across the outputs of opposite pairs of said power bipolar semiconductor transistors of the bridge circuit; and said second semiconductor component means providing output drive signals in response to the selective application of the control signal thereto to cause said first semiconductor component means to provide a desired polarity of energization of the load such that the electric current feed to the load can be switched on and off and reversed in polarity.

3. A semiconductor switch device as set forth in claim 1, wherein said voltage dropping means comprises a constant current circuit connected to the base of said bipolar transistor.

4. A semiconductor switch device as set forth in claim 1, wherein the load is adapted to be connected to said second semiconductor component means;

said second semiconductor component means including detector means responsive to the current through the load and the voltage applied to the load for producing a fault output signal from said second semiconductor component means in dependence upon the sensing by said detector means of an abnormal electrical status associated with the load.

5. A semiconductor switch device as set forth in claim 1, wherein said first semiconductor component means further includes temperature sensing means integrated with said power bipolar semiconductor transistor.

6. A semiconductor switch device as set forth in claim 5, wherein said temperature sensing means comprises a Schottky diode connected to said control input means of said bipolar transistor;
 a resistor interconnected between said Shottky diode and said control input means connected to the base of said bipolar transistor; and
 amplifier means interconnected between said resistor and said control input means connected to the base of said bipolar transistor for amplifying the leakage current of said Schottky diode to divert the base drive current of said bipolar transistor from the base thereof when said bipolar transistor is in its conductive state so as to switch said bipolar transistor to a non-conductive state in response to a temperature increase above a predetermined threshold.

7. A semiconductor switch device as set forth in claim 6, wherein said amplifier means comprises first and second bipolar transistors arranged in a Darlington pair configuration.

8. A semiconductor switch device as set forth in claim 7, wherein said voltage dropping means comprises a constant current circuit connected to the base of said bipolar transistor and disposed between the base of said bipolar transistor and said Darlington pair transistors.

9. A semiconductor switch device responsive to a control signal selectively to pass electric current to a load and to block the passage of electric current to the load, said semiconductor switch device comprising:
 first semiconductor component means including at least one power bipolar semiconductor transistor comprising:
  semiconductor substrate means of one conductivity type having top and bottom major surfaces,
  a first dopant region of the other conductivity type in said semiconductor substrate means of said one conductivity type and opening onto the top surface thereof,
  a second dopant region of said one conductivity type disposed in said first dopant region of the other conductivity type and opening onto the top surface thereof,
  a third dopant region of the other conductivity type disposed in said first dopant region of the other conductivity type and opening onto the top surface thereof, said third dopant region of the other conductivity type having a higher dopant concentration than said first dopant region of the other conductivity type and being disposed in spaced relation to said second dopant region of said one conductivity type provided in said first dopant region of the other conductivity type,
  a fourth dopant region of said one conductivity type disposed in said third dopant region of said other conductivity type of higher dopant concentration,
  said semiconductor substrate means of said one conductivity type and said first, second, third and fourth dopant regions defined therein forming a vertically arranged bipolar transistor having said first dopant region of the other conductivity type as the base, said second dopant region of said one conductivity type as the emitter, and the bottom portion of said substrate means as the collector and having a controlled current path extending from the top surface thereof to the bottom surface thereof, and said fourth dopant region of said one conductivity type defining a control input means connected to the base of said bipolar transistor:;
 second semiconductor component means connected to said control input means and including means responsive to a control signal selectively to produce output drive signals applied to said control input means of said first semiconductor component means for activating said power bipolar semiconductor transistor to be conductive;
 the collector of said power bipolar semiconductor transistor being adapted to be connected in series to the load; and
 said power bipolar semiconductor transistor switching from a non-conductive state to a conductive state for providing electric current to the load in response to an output drive signal from said second semiconductor component means applied to said control input means.

* * * * *